(12) United States Patent  (10) Patent No.: US 8,207,772 B2
Shin  (45) Date of Patent: Jun. 26, 2012

(54) DUTY DETECTION CIRCUIT AND DUTY CYCLE CORRECTION CIRCUIT INCLUDING THE SAME

(75) Inventor: Dong-Suk Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 12/832,092

(22) Filed: Jul. 8, 2010

(65) Prior Publication Data

US 2011/0291725 A1  Dec. 1, 2011

(30) Foreign Application Priority Data

May 31, 2010  (KR) .................. 10-2010-0050800

(51) Int. Cl.
*H03K 3/017* (2006.01)
(52) U.S. Cl. ........................................ 327/175; 327/172
(58) Field of Classification Search .................. 327/172, 327/175
See application file for complete search history.

(56) References Cited

U.S. PATENT DOCUMENTS

| | | | |
|---|---|---|---|
| 6,040,726 A * | 3/2000 | Martin | 327/175 |
| 6,967,514 B2 * | 11/2005 | Kizer et al. | 327/175 |
| 7,180,346 B2 * | 2/2007 | Lee | 327/175 |
| 7,671,646 B2 * | 3/2010 | Cho et al. | 327/156 |
| 7,800,423 B2 * | 9/2010 | Kim et al. | 327/175 |
| 2004/0189364 A1 * | 9/2004 | Lee et al. | 327/175 |
| 2009/0058481 A1 * | 3/2009 | Kim et al. | 327/175 |
| 2010/0109729 A1 * | 5/2010 | Shin | 327/175 |

FOREIGN PATENT DOCUMENTS

KR  1020070111786  11/2007
KR  1020080075286  8/2008

OTHER PUBLICATIONS

Notice of Allowance issued from Korean Intellectual Property Office on Jun. 30, 2011.

* cited by examiner

*Primary Examiner* — Ryan Jager
(74) *Attorney, Agent, or Firm* — IP & T Group LLP

(57) ABSTRACT

A duty cycle correction circuit includes a duty adjustment circuit configured to generate an output clock by adjusting a duty cycle of an input clock in response to a duty adjustment code, a duty detection circuit configured to measure a difference between a width of a high pulse and a width of a low pulse of the output clock at each update period, and generate a duty detection code corresponding to the measured value, an accumulation circuit configured to generate the duty adjustment code by accumulating a value of the duty detection code outputted at each update period, and a toggling number adjustment circuit configured to adjust a toggling number of the output clock, which adjustment determines the update period, according to a frequency of the output clock.

20 Claims, 6 Drawing Sheets

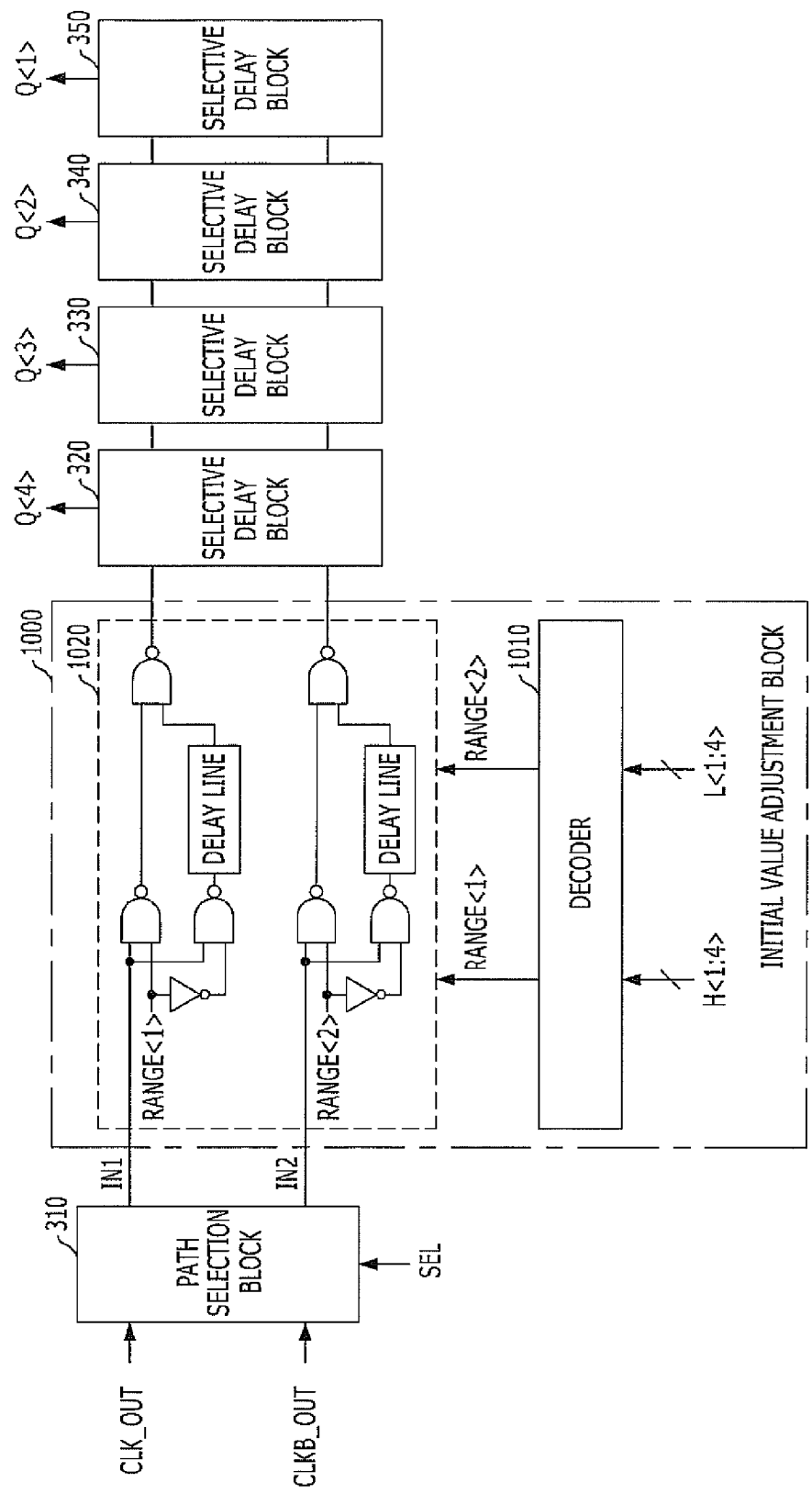

DUTY DETECTION CIRCUIT AND DUTY CYCLE CORRECTION CIRCUIT INCLUDING THE SAME

CROSS-REFERENCE TO RELATED APPLICATIONS

The present application claims priority of Korean Patent Application No. 10-2010-0050800, filed on May 31, 2010, which is incorporated herein by reference in its entirety.

BACKGROUND OF THE INVENTION

Exemplary embodiments of the present invention relate to a semiconductor design technology, and more particularly, to a duty detection circuit and a duty cycle correction circuit including the same.

In semiconductor devices such as semiconductor memory devices designed to operate based on clocks, it is desirable to control a duty cycle of a clock. The 50% duty cycle of the clock means that a "high level duration" and a "low level duration" of a clock signal are equal to each other.

The semiconductor memory device may input/output data in synchronization with rising and falling edges of the clock. In such semiconductor devices, if the duty cycle of the clock is not 50%, data may not be inputted/outputted at the precise timing. Therefore, the semiconductor memory device may employ a duty cycle correction (DCC) circuit in order to adjust the duty cycle to 50%.

A known DCC circuit may have the limitations.

First, the known DCC circuits generate an up/down signal by comparing a width of high pulse and a width of low pulse of a clock and gradually correct a duty ratio according to the up/down signal. Such DCC circuits may complete the duty cycle correction after several comparison operations, and thus, the locking time may be long.

Second, digital type DCC circuits may have difficulty in measuring the duty ratio due to offsets of the duty detection circuits themselves.

Third, the duty cycle correction target, that is, the frequency range of the input clock, may be limited.

SUMMARY OF THE INVENTION

An embodiment of the present invention is directed to a duty cycle correction circuit which is capable of reducing the locking time, correcting the duty cycles of clocks, and correcting the duty cycles of clocks having various frequencies within a reduced/minimum time.

In accordance with an embodiment of the present invention, a duty cycle correction circuit includes a duty adjustment circuit configured to generate an output clock by adjusting a duty cycle of an input clock in response to a duty adjustment code, a duty detection circuit configured to measure a difference between a width of a high pulse and a width of a low pulse of the output clock at each update period, and generate a duty detection code corresponding to the measured value, an accumulation circuit configured to generate the duty adjustment code by accumulating a value of the duty detection code outputted at each update period, and a toggling number adjustment circuit configured to adjust a toggling number of the output clock, which adjustment determines the update period, according to a frequency of the output clock.

In accordance with another embodiment of the present invention, a duty detection circuit includes a measurement unit configured to measure a width of a high pulse of a clock at each update period to generate a high pulse code, and measure a width of a low pulse of the clock at each update period to generate a low pulse code, a frequency detection unit configured to detect a frequency of the clock according to the values of the high pulse code and the low pulse code, a toggling number adjustment circuit configured to adjust a toggling number of the clock, which adjustment determines the update period, according to an output signal of the frequency detection unit; a comparison unit configured to compare the high pulse code with the low pulse code and generate an up/down signal representing which code is larger; and a subtraction unit configured to subtract the smaller value from the larger value among the values of the high pulse code and the low pulse code and generate a difference value code.

BRIEF DESCRIPTION OF THE DRAWINGS

FIGS. 3A and 3B are detailed block diagrams illustrating a measurement unit of FIG. 2 included in the duty detection circuit in accordance with the exemplary embodiment of the present invention.

DESCRIPTION OF SPECIFIC EMBODIMENTS

Figure 1:
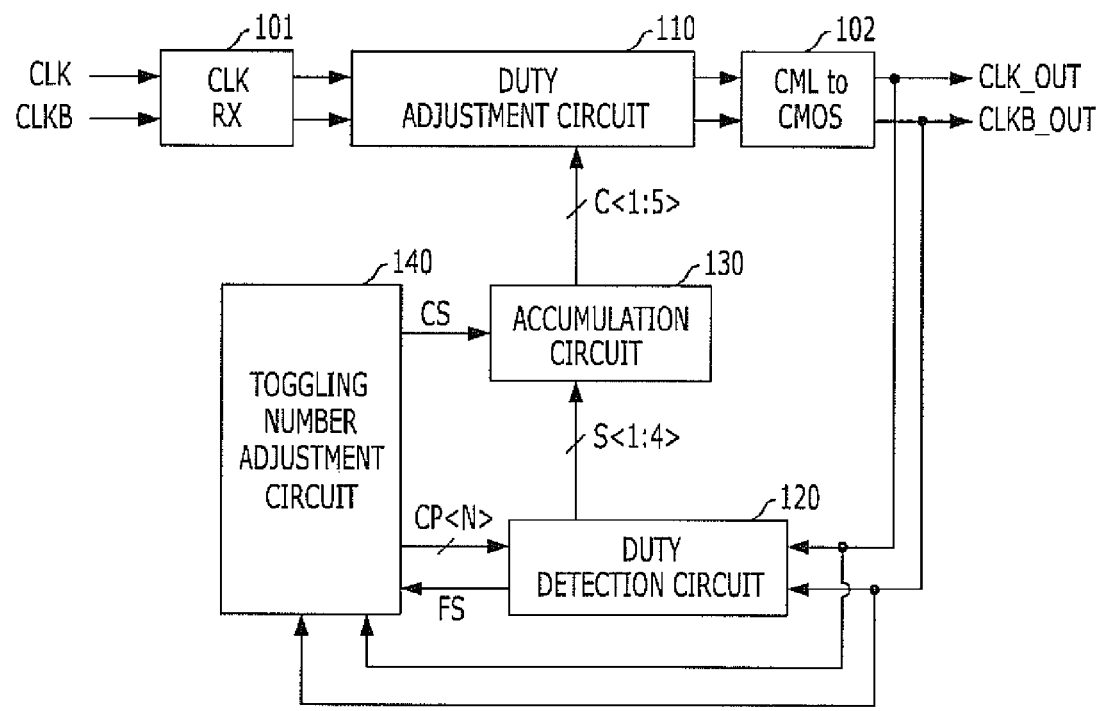
FIG. 1 is a block diagram of a duty cycle correction circuit in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram of a duty cycle correction circuit in accordance with an exemplary embodiment of the present invention.

Referring to FIG. 1, the duty cycle correction circuit in accordance with the exemplary embodiment of the present invention includes a duty adjustment circuit 110, a duty detection circuit 120, an accumulation circuit 130, and a toggling number adjustment circuit 140. The duty adjustment circuit 110 is configured to generate output clocks CLK_OUT and CLKB_OUT by adjusting input clocks CLK and CLKB in response to a duty adjustment code C<1:5>. The duty detection circuit 120 is configured to measure a difference between widths of high pulses and widths of low pulses of the output clocks CLK_OUT and CLKB_OUT, and generate a duty detection code S<1:4> corresponding to the measured values. The accumulation circuit 130 is configured to generate the duty adjustment code C<1:5> by accumulating the duty detection code S<1:4> outputted at each update period. The toggling number adjustment circuit 140 is configured to adjust toggling number of the output clocks CLK_OUT and CLKB_OUT, which are references of the update period, according to frequencies of the output clocks CLK_OUT and CLKB_OUT.

The duty detection circuit 120 measures the widths of high pulses and the widths of low pulses of the output clocks CLK_OUT and CLKB_OUT, and determine the duty detection code S<1:4> according to their difference. The values of the duty cycle correction code C<1:4> corresponding to the difference between the widths of high pulses and the widths of low pulses of the output clocks CLK_OUT and CLKB_OUT may represent distortion degree of the duties of the current clocks, i.e., how much the duty cycle is distorted. Also, according to an example, a comparision unit (220 of FIG. 2) of the duty detection circuit 120 generates an up/down signal UP/DN representing which one of the width of high pulse and the width of low pulse is larger, i.e., the up/down signal UP/DN is a signal which represents the distortion direction of the duty cycle of the clock. Therefore, the values of the duty cycle correction code C<1:4> may represent not only the distortion direction of the duty cycle of the clock, but also the distortion degree of the duty.

The duty detection circuit 120 in accordance with the exemplary embodiment of the present invention generates the information about the distortion degree of the duty cycle as well as the distortion direction. Therefore, the duty cycle correction circuit may correct the duty cycle in 1-cycle operation.

The accumulation circuit 130 generates the duty adjustment code C<1:5> by accumulating the values of the duty detection code S<1:4> outputted from the duty detection circuit 120. The accumulation refers to addition or subtraction of the duty adjustment code S<1:4> outputted at each repetitive update period. The addition or subtraction is determined by the up/down signal UP/DN.

Here, according to an example, information sufficient to correct the duty cycle of the clock may be outputted from the duty detection circuit 120, and the duty cycle of the clock may be adjusted in, for example, one update period. However, the duty cycle of the clock may also be distorted so much that it may not be corrected during one update period. Also, after the duty cycle of the clock is adjusted, the duty cycle may be distorted again by several factors.

As such, the accumulation circuit 130 is arranged to prepare for the case in which the duty cycle correction is not completed in one update period or the case in which the duty cycle is distorted again after the duty cycle correction.

For example, if the initial duty cycle of the clock is distorted by +10 ("+" represents that the width of a high pulse is greater than the width of a low pulse) but the duty cycle of the clock maximally correctable in the one update period is +7, it may not be corrected the duty cycle of the clock in the one update period. Therefore, in this case, the duty cycle of the clock is corrected by +7 in the first update period and then corrected by +3 in the second update period. In this manner, the duty cycle of the clock may be corrected.

However, if the initial duty cycle of the clock is distorted by +5 ("+" represents that the width of high pulse is greater than the width of low pulse), the duty cycle of the clock may be corrected by adjusting the duty cycle of the clock by +5 in the one update period. However, if the duty cycle of the clock is further distorted by +2 after the duty cycle correction, the values of the duty cycle correction code C<1:5> may be adjusted to +7 by adding +2 to +5. Such an operation may be performed by the accumulation circuit 130.

The toggling number adjustment circuit 140 is configured to adjust the toggling number of the output clocks CLK_OUT and CLKB_OUT which are reference of the update period of the duty detection circuit 120, according to the frequencies of the output clocks CLK_OUT and CLKB_OUT.

Specifically, it takes a period of time for the duty detection circuit 120 to measure the widths of high pulses and the widths of low pulses of the output clocks CLK_OUT and CLKB_OUT and generate the corresponding duty detection code S<1:4>. Here, the period of time is shorter than time corresponding to the one update period.

According to an example, the time corresponding to the one update period is determined in accordance with the output clocks CLK_OUT and CLKB_OUT, but, the certain time is not determined in accordance with the output clocks CLK_OUT and CLKB_OUT. Also, the frequencies of the output clocks CLK_OUT and CLKB_OUT are not previously determined.

In accordance with the exemplary embodiment of the present invention, if the frequencies of the output clocks CLK_OUT and CLKB_OUT are lower than a set reference frequency, the toggling number adjustment circuit 140 decreases the toggling number of the output clocks CLK_OUT and CLKB_OUT which are reference of the update period.

For example, if the time corresponding to the one update period is defined as 64 togglings of the output clocks CLK_OUT and CLKB_OUT in such a state that the frequencies of the output clocks CLK_OUT and CLKB_OUT are higher than the set reference frequency, it is controlled such that the time corresponding to the one update period is defined as the 32 togglings of the output clocks CLK_OUT and CLKB_OUT in such a state that the frequencies of the output clocks CLK_OUT and CLKB_OUT are lower than the set reference clock.

Such an operation of the toggling number adjustment circuit 140 may be applied reversely. That is, if the frequencies of the output clocks CLK_OUT and CLKB_OUT are higher than a set second reference frequency, the toggling number of the output clocks CLK_OUT and CLKB_OUT which are reference of the update period may be increased accordingly.

For example, if the time corresponding to the one update period is defined as an amount of time equal to 64 togglings of the output clocks CLK_OUT and CLKB_OUT in such a state that the frequencies of the output clocks CLK_OUT and CLKB_OUT are lower than the set second reference frequency, it is controlled such that the time corresponding to the one update period is defined as an amount of time equal to 128 togglings of the output clocks CLK_OUT and CLKB_OUT in such a state that the frequencies of the output clocks CLK_OUT and CLKB_OUT are higher than the set second reference clock.

The duty adjustment circuit 110 is configured to adjust the duties of the input clocks CLK and the CLKB in response to the duty adjustment code C<1:5>. The duty adjustment code C<1:5> contains information about the distortion direction and the distortion degree of the clock. Thus, the output clocks CLK_OUT and CLKB_OUT may be generated by adjusting the duties of the input clocks CLK and CLKB by using the duty adjustment code C<1:5>.

In FIG. 1, "CLKRX" 101 represents a clock input terminal, and "CML to CMOS" 102 represents a shifter which changes a CML level clock to a CMOS level clock. In the following exemplary embodiment, since the duty adjustment circuit 110 configured to adjust the duty cycle of the clock swinging at a current mode logic (CML) level is exemplified, such configurations are illustrated in FIG. 1. However, whether the duty adjustment circuit 110 adjusts the duty cycle of the clock swinging at a CMOS level or the duty cycle of the clock swinging at a CML level is optional according to situations. Hence, such configurations are not required in the duty cycle correction circuit.

Figure 2:
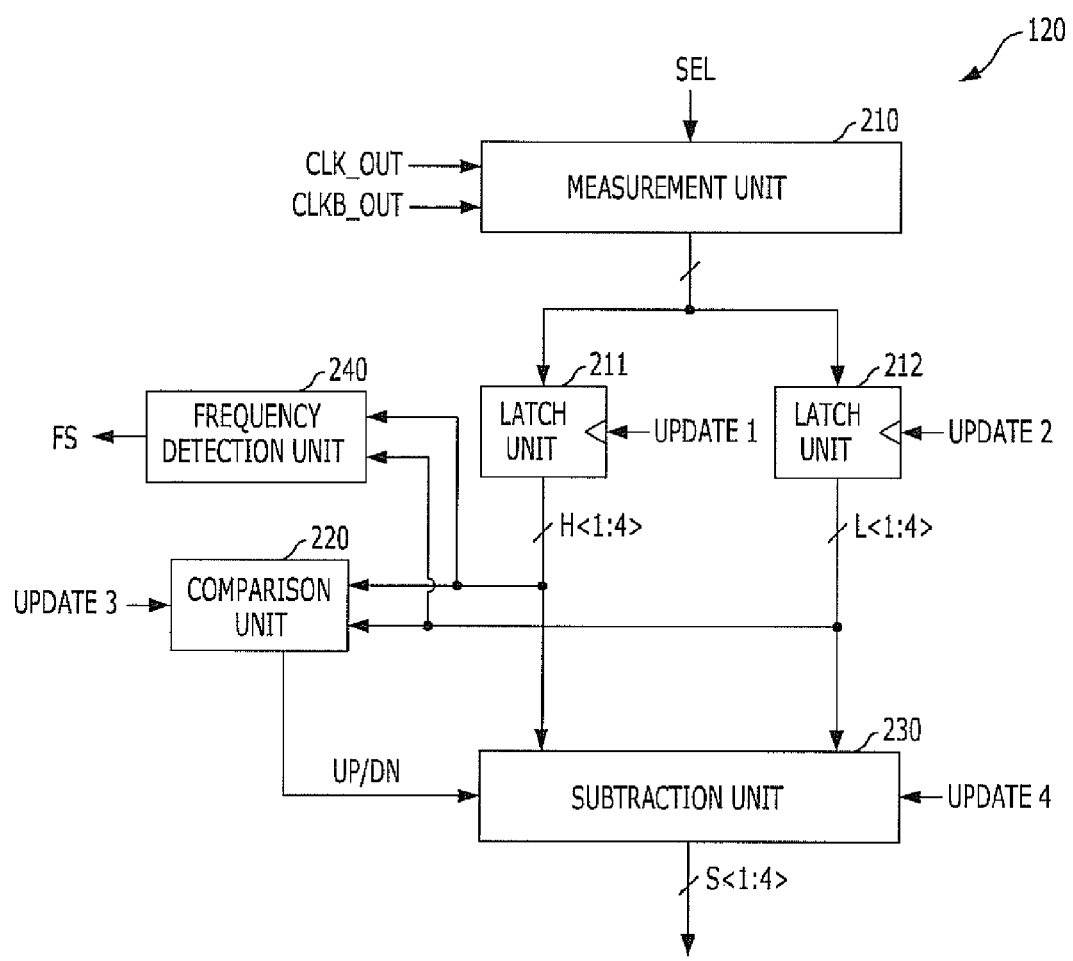
FIG. 2 is a detailed block diagram of a duty detection circuit in the duty cycle correction circuit of FIG. 1 in accordance with the exemplary embodiment of the present invention.

FIG. 2 is a detailed block diagram of the duty detection circuit in the duty cycle correction circuit of FIG. 1 in accordance with the exemplary embodiment of the present invention.

Referring to FIG. 2, the duty detection circuit 120 in accordance with the exemplary embodiment of the present invention includes a measurement unit 210, a comparison unit 220, a subtraction unit 230, and a frequency detection unit 240. The measurement unit 210 is configured to measure the widths of high pulses of the output clocks CLK_OUT and CLKB_OUT to generate a high pulse code H<1:4>, and measure the widths of low pulses of the output clocks CLK_OUT and CLKB_OUT to generate a low pulse code L<1:4>. The frequency detection unit 240 is configured to detect frequencies of the output clocks CLK_OUT and CLKB_OUT according to the values of the high pulse code H<1:4> and the low pulse code L<1:4>. The comparison unit 220 is configured to compare the high pulse code H<1:4> with the low pulse code L<1:4> and generate an up/down signal UP/DN representing which code is larger. The subtraction unit 230 is configured to subtract the smaller value from the larger value among the values of the high pulse code H<1:4> and the low pulse code L<1:4> and generate a difference value code S<1:4>.

The measurement unit 210 measures the widths of high pulses and the widths of low pulses of the output clocks CLK_OUT and CLKB_OUT and generates the high pulse code H<1:4> and the low pulse code L<1:4>. The measurement of the widths of high pulses and the widths of low pulses may be sequentially performed by the measurement unit 210. The measurement of the widths of high pulses, according to an example, is performed while a signal SEL is at a "high" level, and the measurement of the widths of low pulses is performed while the signal SEL is at a "low" level. Therefore, in this case, the high pulse code H<1:4> is first outputted through the output terminal of the measurement unit 210, and the low pulse code L<1:4> is then outputted through the output terminal of the measurement unit 210.

Latch units 211 and 212 coupled to the output terminal of the measurement unit 210 are configured to store the high pulse code H<1:4> and the low pulse code L<1:4>, respectively. Although the latch units 211 and 212 are illustrated as elements separated from the measurement unit 210, the latch units 211 and 212 may be arranged within the measurement unit 210. The latch units 211 and 212 are configured to store the high pulse code H<1:4> and the low pulse code L<1:4>. Here, the duty detection circuit 120 may be configured without the latch units 211 and 212 if the timing tuning of the elements within the duty detection circuit 210 is appropriately controlled. Signals UPDATE1 and UPDATE2 inputted to the latch units 211 and 212 are signals which determine the timing in which the latch units 211 and 212 receive the high pulse code H<1:4> and the low pulse code L<1:4>.

The frequency detection unit 240 is configured to analyze patterns of the high pulse code H<1:4> and the low pulse code L<1:4>, and determine whether the frequencies of the output clocks CLK_OUT and CLKB_OUT are higher or lower than the set reference frequency. Then, the frequency detection unit 240 transfers the corresponding logic level of a signal FS and transfers the signal FS to the toggling number adjustment circuit 140.

The comparison unit 220 is configured to compare the high pulse code H<1:4> with the low pulse code L<1:4> and generates an up/down signal UP/DN representing which code is larger. A signal UPDATE3 inputted to the comparison unit 220 is a signal which determines the timing in which the high pulse code H<1:4> and the low pulse code L<1:4> are inputted to the comparison unit 220.

The subtraction unit 230 calculates the difference of the code value between the high pulse code H<1:4> and the low pulse code L<1:4>, that is, the difference between the widths of high pulses and the widths of low pulses. The subtraction unit 230 is configured to subtract the smaller value from the larger value among the values of the high pulse code H<1:4> and the low pulse code L<1:4> and generates the difference value code S<1:4>. A signal UPDATE4 inputted to the subtraction unit 230 is a signal which determines the timing in which the high pulse code H<1:4> and the low pulse code L<1:4> are inputted to the subtraction unit 230.

For reference, the activation timings and periods of the signals SEL, UPDATE1, UPDATE2 and UPDATE4 for determining the operation timings of the elements arranged in the duty detection circuit 120, that is, the measurement unit 210, the latch units 211 and 212, and the subtraction unit 230, are determined corresponding to a signal CP<N> applied from the toggling number adjustment circuit 140 to the duty detection circuit 120.

Figure 3A:
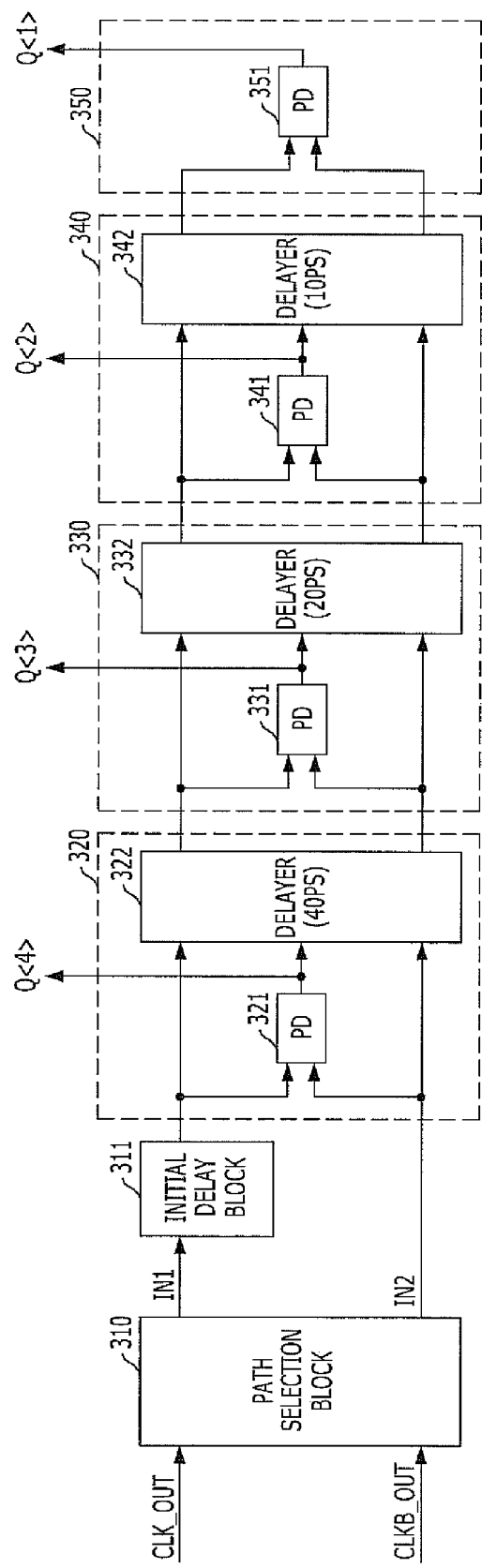

FIGS. 3A and 3B are detailed block diagrams illustrating the measurement unit of FIG. 2 included in the duty detection circuit in accordance with the embodiment of the present invention.

Referring to FIG. 3A, the measurement unit 210 included in the duty detection circuit 120 in accordance with the exemplary embodiment of the present invention includes a path selection block 310 and a plurality of selective delay blocks 320 to 350. The path selection block 310 is configured to transfer the positive clock CLK_OUT and the negative clock CLKB_OUT of the output clocks to a first path IN1 and a second path IN2. The plurality of selective delay blocks 320 to 350 are coupled in series and configured to receive the clocks transferred through the first path IN1 and the second path IN2 and measure the widths of high pulses or the widths of low pulses.

According to an example, the path selection block 310 is configured to transfer the positive clock CLK_OUT to the first path IN1 and the negative clock CLKB_OUT to the second path IN2 while the signal SEL is at a "high" level. The path selection block 310 transfers the negative clock CLKB_OUT to the first path IN1 and the positive clock CLK_OUT to the second path IN2 while the signal SEL is at a "low" level. The period in which the signal SEL is at the "high" level is a period in which the widths of high pulses of the output clocks CLK_OUT and CLKB_OUT are measured. The period in which the signal SEL is at the "low" level is a period in which the widths of low pulses of the output clocks CLK_OUT and CLKB_OUT are measured.

The plurality of selective delay blocks 320 to 350 include phase comparators 321, 331, 341 and 351 and delayers 322, 332 and 342, respectively. The phase comparators 321, 331, 341 and 351 are configured to compare a phase of the clock of the first path IN1 with a phase of the clock of the second path IN2. The delayers 322, 332 and 342 are configured to delay the clock of the first path IN1 or the second path IN2 according to comparison results Q<4>, Q<3>, Q<2> and Q<1> of the phase comparators 321, 331, 341 and 351.

According to an example, the phase comparators 321, 331, 341 and 351 are configured to output a value of "1" if the rising edge of the clock transferred through the first path IN1 leads the rising edge of the clock transferred through the second path IN2, and outputs a value of "0" in the opposite case. The delayers 322, 332 and 342 are configured to delay the clock of the first path IN1 if the comparison results Q<4>, Q<3> and Q<2> of the phase comparators 321, 331 and 341 are "1", and delays the clock of the second path IN2 if the comparison results Q<4>, Q<3> and Q<2> of the phase comparators 321, 331 and 341 are "0". The delay values of the delayers 322, 332 and 342 are designed to have binary weights such as 40 ps, 20 ps, and 10 ps.

If the positive clock CLK_OUT is inputted to the first path IN1 and the negative clock CLKB_OUT is inputted to the second path IN2, the output values Q<4>, Q<3>, Q<2> and Q<1> of the phase comparators 321, 331, 341 and 351 become the high pulse code H<1:4> (Q<1:4>=H<1:4>). If the negative clock CLKB_OUT is inputted to the first path IN1 and the positive clock CLK_OUT is inputted to the second path IN2, the output values Q<4>, Q<3>, Q<2> and Q<1> of the phase comparators 321, 331, 341 and 351 become the low pulse code L<1:4> (Q<1:4>=L<1:4>).

It can be seen from FIG. 3A that the delay may not be provided in the last selective delay block 250 because there is no subsequent selective delay block.

An initial delay block 311 is configured to constantly delay the clock transferred through the first path IN1 in order to perform the rapid measurement of the high pulse code H<1:4> and the low pulse code L<1:4>. If the operation of the measurement unit 210 is completed within one update period, the initial delay block 311 is not a requisite element. However, in case where the operation of the measurement unit 210 is completed within plural repetitive update periods, the initial delay block 311 is a requisite element because the clock transferred through the first path IN1 must be delayed in advance by the delay amount which has been delayed in the previous update period. The detailed configuration in which the initial delay block 311 operates as a requisite element will be described later with reference to FIG. 3B.

In this exemplary embodiment, the high pulse code H<1:4> and the low pulse code L<1:4> of the output clocks CLK_OUT and CLKB_OUT are measured using the same selective delay blocks 320, 330, 340 and 350, and the duty cycle is detected using the difference between the measured high pulse code H<1:4> and the measured low pulse code L<1:4>. Therefore, even though offset occurs in the selective delay blocks 320, 330, 340 and 350 during the fabrication process, the offset may be reduced during the operation of calculating the difference between the high pulse code H<1:4> and the low pulse code L<1:4>.

Although it is illustrated in FIG. 3A that the high pulse code H<1:4> and the low pulse code L<1:4> are generated through the same selective delay blocks 320, 330, 340 and 350 while changing the paths of the positive clock CLK_OUT and the negative clock CLKB_OUT by using the path selection block 310, the selective delay blocks for measuring the high pulse code H<1:4> and the selective delay blocks for measuring the low pulse code L<1:4> may be designed to be separately arranged without the path selection block 310.

Referring to FIG. 3B, the initial delay block 311 of the measurement unit 210 illustrated in FIG. 3A is replaced with an initial value adjustment block 1000. While it is illustrated as if the initial delay block 311 performs only the operation of delaying the clock transferred through the first path IN1 in advance, the initial value adjustment block 1000 can delay the clock transferred through the first path IN1 or the second path IN2 in advance.

Specifically, the initial value adjustment block 1000 illustrated in FIG. 3B changes the initial delay value of the first path IN1 or the second path IN2 in a next update period if it receives the high pulse code H<1:4> and the low pulse code L<1:4> stored in the latch units 211 and 212 in a corresponding update period and the values of the high pulse code H<1:4> or the second low pulse code L<1:4> are the maximum value "1111" or the minimum value "0000".

Here, the high pulse code H<1:4> or the low pulse code L<1:4> outputted in the corresponding update period that are measured to be the maximum value "1111" or the minimum value "0000" represents that the difference of the delay amount between the clock applied through the first path IN1 and the clock applied through the second path IN2 is too large to correct the difference of the delay amount between the clock applied through the first path IN1 and the clock applied through the second path IN2 by one operation of the plurality of selective delay blocks 320, 330, 340 and 350 in the corresponding update period.

In particular, in case where the high pulse code H<1:4> or the low pulse code L<1:4> outputted in the corresponding update period has the maximum value "1111", the clock of the second path IN2 is behind the clock of the first clock IN1 even though the clock of the first path IN1 is delayed by the delay amount corresponding to the plurality of selective delay blocks 320, 330, 340 and 350. Thus, in a next update period, the operation is performed in such a state that the initial delay value of the first path IN1 is increased by a step.

On the other hand, in case where the high pulse code H<1:4> or the low pulse code L<1:4> outputted in the corresponding update period has the minimum value "0000", the clock of the first path IN1 is behind the clock of the second clock IN2 even though the clock of the second path IN2 is delayed by the delay amount corresponding to the plurality of selective delay blocks 320, 330, 340 and 350. Thus, in a next update period, the operation is performed in such a state that the initial delay value of the second path IN2 is increased by a step.

As described above, the initial value adjustment block 1000 may include a decoder 1010 and a delay 1020. The decoder 1020 is configured to activate a signal RANGE<1> to a "low" level if the high pulse code H<1:4> or the low pulse code L<1:4> is measured to be the maximum value. Also, the decoder 1010 is configured to activate a signal RANGE<2> to a "low" level if the high pulse code H<1:4> or the low pulse code L<1:4> is measured to be the minimum value.

The delay 1020 is configured to increase the delay value of the first path IN1 if the signal RANGE<1> is activated to a "low" level, and increase the delay value of the second path IN2 if the signal RANGE<2> is activated to a "low" level, in order to generate properly the high pulse code H<1:4> and the low pulse code L<1:4>.

Meanwhile, that the high pulse code H<1:4> or the low pulse code L<1:4> outputted in the corresponding update period is measured to be the maximum "1111" or the minimum value "0000" means that the phase difference between the clock applied through the first path IN1 and the clock applied through the second path IN2 is large as much. That the phase difference between the clocks is large means that the frequency of the clock is low as much.

Therefore, the frequency detection unit 240 included in the duty detection circuit 120 can detect the frequency of the clock according to the patterns of the high pulse code H<1:4> or the low pulse code L<1:4> outputted in the corresponding update period.

Figure 4:
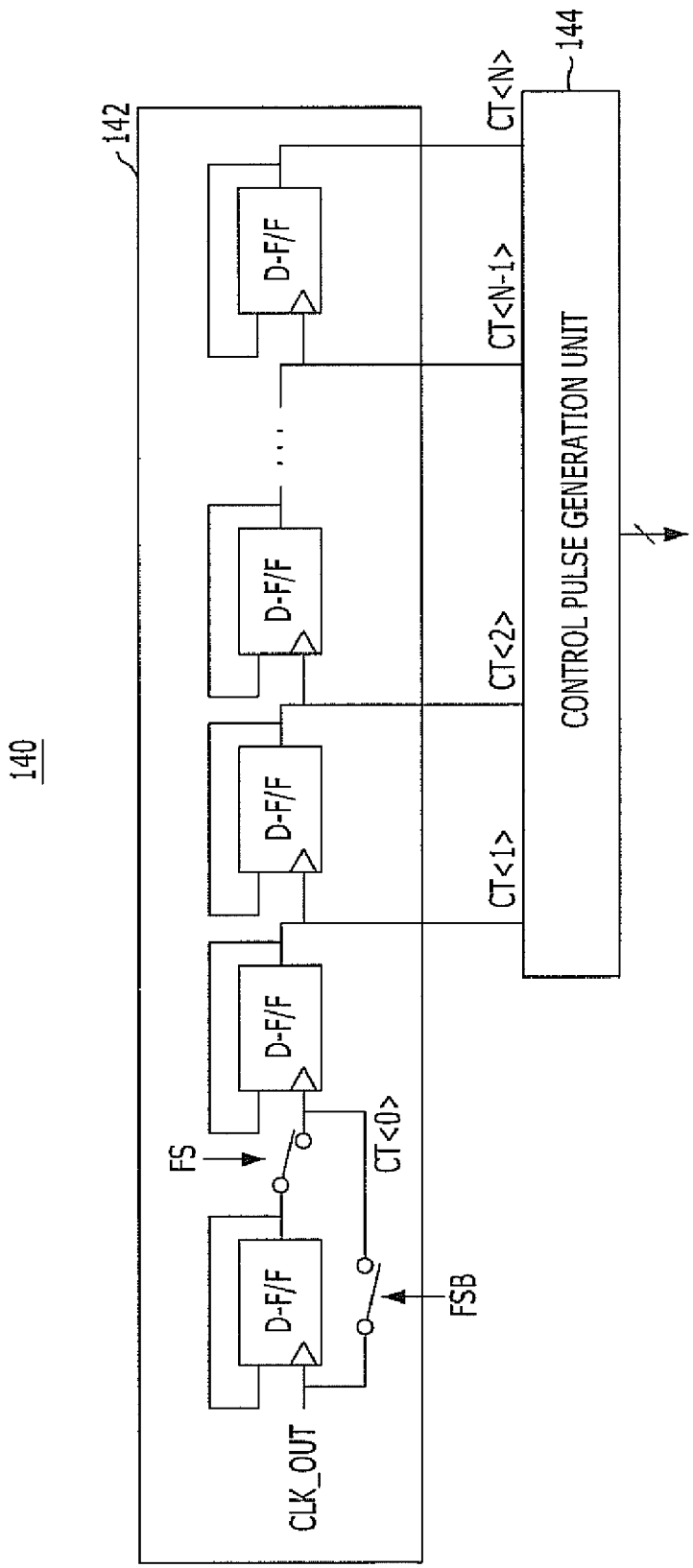
FIG. 4 is a detailed block diagram of a toggling number adjustment circuit included in the duty cycle correction circuit of FIG. 1 in accordance with the exemplary embodiment of the present invention.

FIG. 4 is a detailed block diagram of the toggling number adjustment circuit included in the duty cycle correction circuit of FIG. 1 in accordance with the exemplary embodiment of the present invention.

Referring to FIG. 4, the toggling number adjustment circuit 140 in accordance with the exemplary embodiment of the present invention is configured to determine the length of the update period by repetitively counting the toggling of the output clocks CLK_OUT and CLKB_OUT by a certain number of times. The toggling number adjustment circuit 140 includes a clock counting section 142 and a control pulse generation unit 144. Here, the clock counting section 142 is configured to change the certain number of times according to the output signal FS of the frequency detection unit 240. Here, the control pulse generation unit 144 is configured to generate the control pulses CP<N> and CS for controlling the operations of the duty detection circuit 120 and the accumulation circuit 130 in response to an output signal of the clock counting section 142.

In the clock counting section 142, according to an example, the counting number of the case where the output signal FS of the frequency detection unit 240 is activated is two times larger than the counting number of the case where the output signal FS of the frequency detection unit 240 is deactivated.

For example, if the output signal FS of the frequency detection unit 240 is activated and the frequencies of the output clocks CLK_OUT and CLKB_OUT are detected as higher than the reference frequency, the length of the update period is determined corresponding to 128 togglings of the output clocks CLK_OUT and CLKB_OUT.

However, when the output signal FS of the frequency detection unit 240 is deactivated and the frequencies of the output clocks CLK_OUT and CLKB_OUT are detected as lower than the reference frequency, the length of the update period is determined to be an amount of time corresponding to 64 togglings of the output clocks CLK_OUT and CLKB_OUT.

That is, the clock counting section 142 can change the toggling number of the output clocks CLK_OUT and CLKB_OUT, which are reference of the update period, in response to the output signal FS of the frequency detection unit 240.

For reference, although it is illustrated that the output signal FS of the frequency detection unit 240 has 1 bit, the output signal FS of the frequency detection unit 240 may have 2 or more bits.

Figure 5:
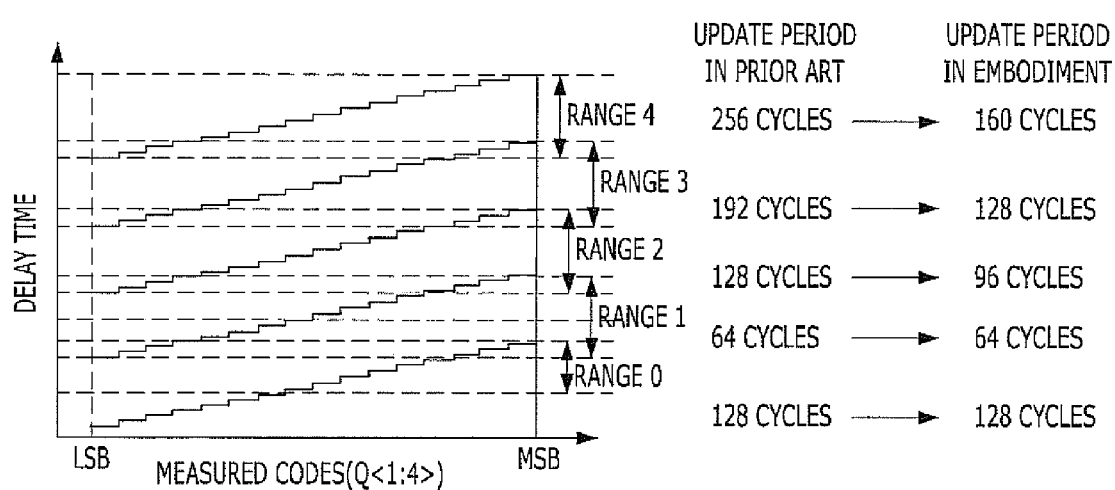
FIG. 5 is a timing diagram illustrating the operation of the duty detection circuit which changes according to whether the toggling number adjustment circuit operates or not.

FIG. 5 is a timing diagram illustrating the operation of the duty detection circuit 120 which changes according to whether the toggling number adjustment circuit operates or not.

Referring to FIG. 5, if the initial delay increases stepwise as follows: RANGE1→RANGE2→RANGE3→RANGE4, or decreases as follows: RANGE1→RANGE0 according to the repetition of the update period, the duty difference of the clock which may be measured by the measurement unit 210 included in the duty detection circuit 120 is changed.

Here, in the update period, that the initial delay increase stepwise through the repetitive processes (RANGE1→RANGE2→RANGE3→RANGE4→RANGE4) means that the frequencies of the output clocks CLK_OUT and CLKB_OUT are low. In the update period in accordance with the exemplary embodiment of the present invention, the interval of the toggling number of the output clocks CLK_OUT and CLKB_OUT, which are the reference of the update period, is changed to "64 cycles" or "32 cycles" (128 cycles←64 cycles→96 cycles→128 cycles→160 cycles) during the procedure in which the initial delay increases stepwise (RANGE1→RANGE2→RANGE3→RANGE4) or decreases (RANGE1→RANGE0) through the repetitive processes.

That is, if the update period enters the operation that the initial delay increase stepwise (RANGE1→RANGE2→RANGE3→RANGE4) through the repetitive process, the frequencies of the output clocks CLK_OUT and CLKB_OUT are recognized to be low. In the operation of the duty detection circuit 120 in accordance with the exemplary embodiment of the present invention, the toggling number of the output clocks CLK_OUT and CLKB_OUT corresponding to the length of the update period is changed from "64 cycles" to "32 cycles".

Therefore, in the operation of the duty detection circuit 120 in accordance with the exemplary embodiment of the present invention, the length of the update period may not increase to above a specific range even though the update period is repeated. Hence, the time taken to generate the output clocks CLK_OUT and CLKB_OUT may be reduced by adjusting the duties of the input clocks CLK and CLKB.

As described above, the duty cycle may be corrected using the difference of the values obtained by measuring the widths of high pulses and the widths of low pulses at each update period. Therefore, according to an example, the duty ratio may be corrected through one update period operation, and the locking time may decrease.

Furthermore, the widths of high pulses and the widths of low pulses are measured through the substantially same configuration, and the difference of the measured values is used. Hence, the offsets occurring while measuring the widths of high pulses and the widths of low pulses may be reduced.

Moreover, since the toggling number of the clock, which is the reference of the update period, is changed according to the frequency of the clock, the update period may be always maintained at the minimum/reduced length.

While the present invention has been described with respect to the specific embodiments, it will be apparent to those skilled in the art that various changes and modifications may be made without departing from the spirit and scope of the invention as defined in the following claims.

What is claimed is:

1. A duty cycle correction circuit comprising:
    a duty adjustment circuit configured to generate an output clock by adjusting a duty cycle of an input clock in response to a duty adjustment code;
    a duty detection circuit configured to measure a difference between a width of a high pulse and a width of a low pulse of the output clock at each update period, and generate a duty detection code corresponding to the measured value;
    an accumulation circuit configured to generate the duty adjustment code by accumulating a value of the duty detection code outputted at each update period; and
    a toggling number adjustment circuit configured to adjust a toggling number of the output clock according to a frequency of the output clock.

2. The duty cycle correction circuit of claim 1, wherein the duty detection circuit is configured to output the duty detection code according to an up/down signal representing which one of the width of the high pulse and the width of the low pulse is larger.

3. The duty cycle correction circuit of claim 2, wherein the accumulation circuit is configured to perform an addition or subtraction of the value of the duty detection code and a value of a previous duty adjustment code according to the up/down signal.

4. The duty cycle correction circuit of claim 1, wherein the duty detection circuit comprises:
    a measurement unit configured to measure the width of the high pulse of the output clock to generate a high pulse code, and measure the width of the low pulse of the output clock to generate a low pulse code;
    a frequency detection unit configured to detect a frequency of the output clock according to the values of the high pulse code and the low pulse code;

a comparison unit configured to compare the high pulse code with the low pulse code and generate the up/down signal representing which code is larger; and a subtraction unit configured to subtract the smaller value from the larger value among the values of the high pulse code and the low pulse code and generate the duty detection code.

5. The duty cycle correction circuit of claim 4, wherein the measurement unit comprises a plurality of selective delay blocks coupled in series to receive a positive clock of the output clock and a negative clock of the output clock, and measure the width of the high pulse and the width of the low pulse, each of the plurality of selective delay blocks comprising:

a phase comparator configured to compare a phase of the positive clock and a phase of the negative clock; and a delayer configured to delay the positive clock or the negative clock according to the comparison result of the phase comparator.

6. The duty cycle correction circuit of claim 5, wherein the measurement unit is configured to sequentially measure the width of the high pulse and the width of the low pulse, and the positive clock and the negative clock are reversely inputted to the plurality of selective delay blocks when the width of the high pulse is measured and when the width of the low pulse is measured.

7. The duty cycle correction circuit of claim 6, wherein the comparison result outputted from the respective phase comparators comprises the high pulse code or the low pulse code.

8. The duty cycle correction circuit of claim 4, wherein the accumulation circuit comprises:

a latch unit configured to store the duty adjustment code; and an operation unit configured to perform an addition or subtraction of the value of the duty detection code and the value of the duty adjustment code, which is stored in the latch unit, in response to the up/down signal.

9. The duty cycle correction circuit of claim 4, wherein the toggling number adjustment circuit is configured to decrease the toggling number of the output clock, which is the reference of the update period, in response to the detection result of the frequency detection unit if the frequency of the output clock is lower than a set reference frequency.

10. The duty cycle correction circuit of claim 9, wherein the toggling number adjustment circuit is configured to increase the toggling number of the output clock, which is the reference of the update period, in response to the detection result of the frequency detection unit if the frequency of the output clock is higher than a set reference frequency.

11. The duty cycle correction circuit of claim 4, wherein the toggling number adjustment circuit comprises:

a clock counting section configured to determine the length of the update period by repetitively counting the toggling of the output clock as many as a set number of times, the set number of times being changed according to the output signal of the frequency detection unit; and a control pulse generation unit configured to generate a control pulse for controlling the operations of the duty detection circuit and the accumulation circuit in response to an output signal of the clock counting section.

12. The duty cycle correction circuit of claim 1, wherein the duty adjustment circuit is configured to correct the duty cycle by adjusting a level of the clock in response to the duty adjustment code.

13. A duty detection circuit comprising:

a measurement unit configured to measure a width of a high pulse of a clock at each update period to generate a high pulse code, and measure a width of a low pulse of the clock at each update period to generate a low pulse code;

a frequency detection unit configured to detect a frequency of the clock according to the values of the high pulse code and the low pulse code;

a toggling number adjustment circuit configured to adjust a toggling number of the clock according to an output signal of the frequency detection unit;

a comparison unit configured to compare the high pulse code with the low pulse code and generate an up/down signal representing which code is larger; and a subtraction unit configured to subtract the smaller value from the larger value among the values of the high pulse code and the low pulse code and generate a difference value code.

14. The duty detection circuit of claim 13, wherein the measurement unit comprises:

a path selection section configured to transfer a positive clock of the clock and a negative clock of the clock to a first path and a second path; and a plurality of selective delay blocks coupled in series to receive the clocks transferred through the first path and the second path and measure the width of the high pulse or the width of the low pulse, each of the plurality of selective delay blocks comprising:

a phase comparator configured to compare a phase of the clock of the first path and a phase of the clock of the second path; and a delayer configured to delay the clock of the first path or the clock of the second path according to the comparison result of the phase comparator.

15. The duty detection circuit of claim 14, wherein the measurement unit is configured to sequentially measure the width of the high pulse and the width of the low pulse and transfer the positive clock and the negative clock through different paths when the width of the high pulse is measured and when the width of the low pulse is measured.

16. The duty detection circuit of claim 15, further comprising an initial value adjustment unit configured to adjust an initial delay value of the first path or the second path in a next update period, if one of the high pulse code and the low pulse code has a maximum value or a minimum value in a corresponding update period.

17. The duty detection circuit of claim 15, further comprising an initial value adjustment unit configured to adjust an initial delay value of the first path or the second path in a next update period, if one of the high pulse code and the low pulse code has a maximum value or a minimum value in a corresponding update period and a difference between the value of the high pulse code and the value of the low pulse code is equal to or less than a predetermined value.

18. The duty detection circuit of claim 13, wherein the toggling number adjustment circuit is configured to decrease the toggling number of the clock, which is the reference of the update period, in response to the detection result of the frequency detection unit if the frequency of the clock is lower than a set reference frequency.

19. The duty detection circuit of claim 18, wherein the toggling number adjustment circuit is configured to increase the toggling number of the clock, which is the reference of the update period, in response to the detection result of the frequency detection unit if the frequency of the clock is higher than a set reference frequency.

20. The duty detection circuit of claim 13, wherein the toggling number adjustment circuit comprises:

a clock counting section configured to determine the length of the update period by repetitively counting the toggling of the clock as many as a set number of times, the set number of times being changed according to the output signal of the frequency detection unit; and a control pulse generation unit configured to generate a control pulse for controlling the operations of the measurement unit, the comparison unit, and the subtraction unit in response to an output signal of the clock counting section.

* * * * *